US006492873B1

(12) United States Patent
Case (10) Patent No.: US 6,492,873 B1
(45) Date of Patent: Dec. 10, 2002

(54) METHOD OF DISTRIBUTED AMPLIFIER DESIGN UTILIZING FILTER SYNTHESIS TECHNIQUES

(76) Inventor: Michael Garth Case, 1140 Canyon Crest Ct., Thousand Oaks, CA (US) 91360

( * ) Notice: Subject to any disclaimer, the term of this patent is extended or adjusted under 35 U.S.C. 154(b) by 0 days.

(21) Appl. No.: 09/992,116

(22) Filed: Nov. 5, 2001

(51) Int. Cl.[7] .............................................. H03F 3/60
(52) U.S. Cl. ....................... 330/286; 330/295; 330/306
(58) Field of Search ................................ 330/286, 295, 330/302, 303, 306

(56) References Cited

U.S. PATENT DOCUMENTS 4,564,817 A * 1/1986 Gilson et al. ............... 330/286
4,733,195 A * 3/1988 Tserng et al. ............... 330/286
4,788,511 A * 11/1988 Schindler .................... 330/277
5,349,306 A * 9/1994 Apel ........................... 330/227

* cited by examiner

*Primary Examiner*—Benny Lee
*Assistant Examiner*—Henry Choe (57) ABSTRACT

The present invention describes the method and system of applying filter synthesis technique to distributed amplifier design. The method for synthesizing a distributed amplifier comprises the steps of determining an appropriate filter design characteristic, computing inductor and capacitor values, converting the equivalent values into a distributed amplifier with response characteristics that mirror that of the chosen filter. Applying filter synthesis techniques to distributed amplifier design results in predictable amplifier response characteristics. Filter synthesis techniques are used to design filters with controllable characteristics such as gain, cut-off frequency, and roll-off slope. Depending on the desired filter characteristics, appropriate inductor and capacitor sizes can be determined. Transferring these chosen inductors and capacitors sizes to the distributed amplifier results in amplitude and phase responses that behave like a preferred embodiment or prototype filter.

6 Claims, 11 Drawing Sheets

METHOD OF DISTRIBUTED AMPLIFIER DESIGN UTILIZING FILTER SYNTHESIS TECHNIQUES

FIELD OF THE INVENTION

This invention relates to distributed amplifier circuit design, more particularly to the application of filter synthesis techniques for controlling distributed amplifier characteristics.

BACKGROUND OF THE INVENTION

Distributed amplifiers are common circuits found in numerous applications such as telecommunications, sensing, and instrumentation. A principal feature of distributed amplifiers is that it provides broad frequency amplification with nearly uniform gain and delay response. Synthesis of these amplifiers has been primarily based on synthetic transmission line construction, i.e. uniform unit cells. This structure poses several disadvantages, the two most significant being large gain ripple and large group delay variation as the signal frequency approaches the band-edge. The effect of these performance limitations is significantly distorted signals, e.g. pulse waveforms. Reducing or eliminating gain and/or delay variations maintain the integrity of the signal as it passes through the distributed amplifier. To date, the primary approach to improving the response of distributed amplifiers has been to reduce the size of the uniform sections. This is an incomplete approach that also degrades circuit performance. Numerous other improvements have also been documented, but none address the problems of gain and delay variation. As the speed of digital signal transmission increases and higher frequencies are used, the detrimental effects of gain and delay variations increase as well.

Accordingly, there is a need for a distributed amplifier that produces a more uniform gain and delay over a wide bandwidth.

SUMMARY OF THE INVENTION

The present invention describes the method and system of applying filter synthesis techniques to distributed amplifier design. The method for synthesizing a distributed amplifier comprises the steps of determining an appropriate filter design characteristic, computing inductor and capacitor values, converting the equivalent values into a distributed amplifier with response characteristics that mirror that of the chosen filter.

Applying filter synthesis techniques to distributed amplifier design results in predictable amplifier response characteristics. Filter synthesis techniques are used to design filters with controllable characteristics such as gain, cut-off frequency, and roll-off slope. Depending on the desired filter characteristics, appropriate inductor and capacitor sizes can be determined. Transferring these chosen inductors and capacitors sizes to the distributed amplifier results in amplitude and phase responses that behave like the preferred embodiment or prototype filter. Advantageously, this method of utilizing filter-based L-C (Inductor-Capacitor) sizes provides improved performance of the distributed amplifier; e.g. minimal amplitude variation, minimal delay variation, controlled roll-off characteristics.

DETAILED DESCRIPTION

Figure 1:
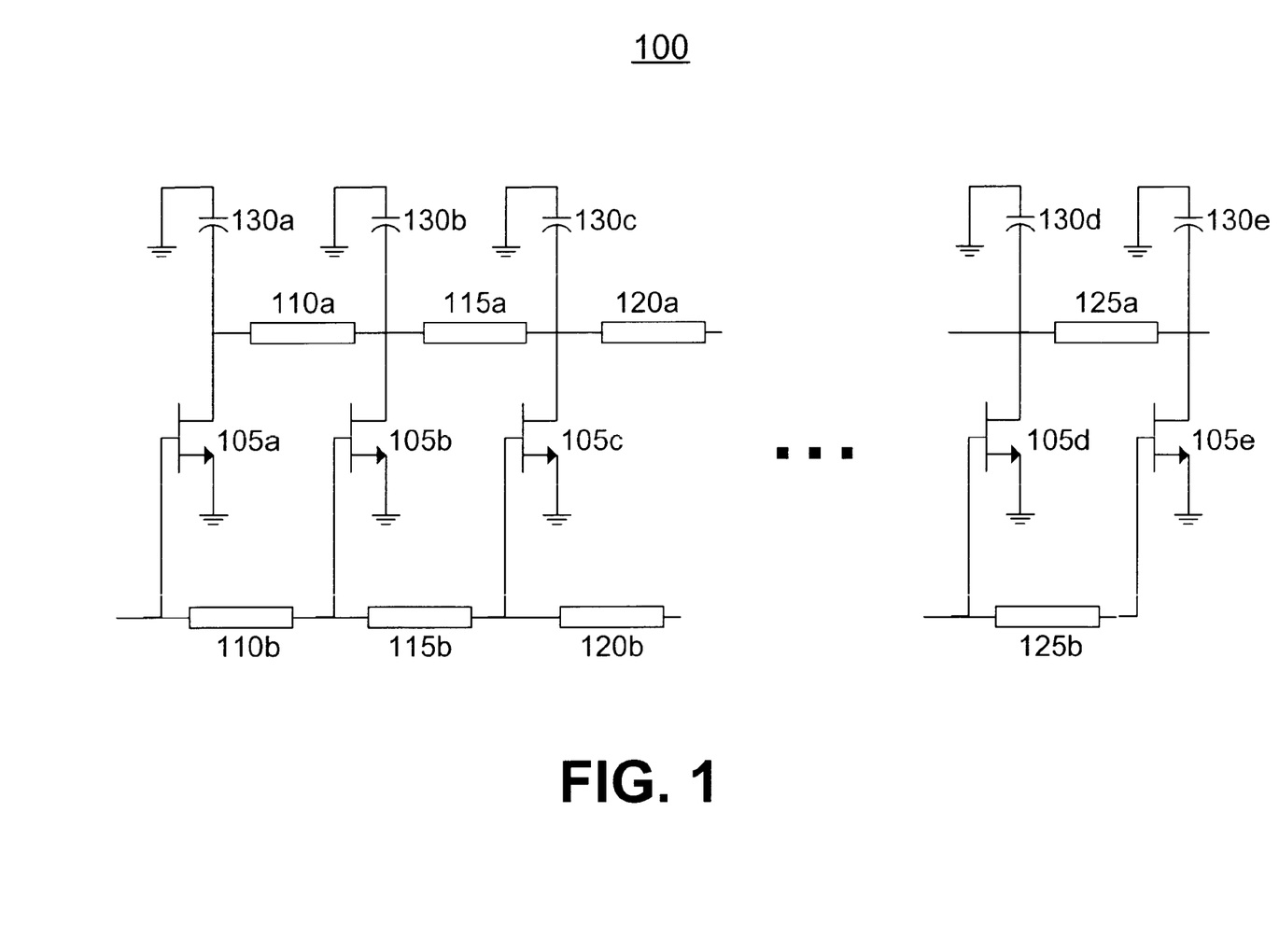
FIG. 1 is a prior art circuit diagram that illustrates a distributed amplifier design with an L-C ladder network.

FIG. 1 is a circuit diagram that depicts the topology of a distributed amplifier with an L-C ladder network. The figure comprises a series of transistors, in this embodiment depicted as field-effect transistors (FETs) $105a$, $105b$, $105c$, $105d$, and $105e$, separated by transmission lines $110a$, $110b$, $115a$, $115b$, $120a$, $120b$, $125a$, and $125b$. A transistor's output capacitance is usually smaller than its input capacitance, so capacitors $130a$–$130e$ are utilized to match capacitances on the output line (the transmission line comprising transmission lines $110a$, $115a$, $120a$–$125a$) with the input line (the transmission line comprising lines $110b$, $115b$, $120b$–$125b$).

Distributed amplifier 100 is shown with an indeterminate number of stages. Generally, gain increases for each stage that is added, but is limited by attenuation from the transmission lines $110a$, $110b$, $115a$, $115b$, $120a$, $120b$, $125a$, and $125b$, and transistors $105a$, $105b$, $105c$, $105d$, and $05e$. Beyond an optimum number of stages, the gain achieved from an additional stage is superseded by the increased attenuation from the added transmission lines and transistors.

The parasitic capacitances of the transistors $105a$–$105e$ within distributed amplifier 100 are compensated to have minimal effect. Transistors contain spurious reactive elements that restrict its performance, but a network of inductors and capacitors behaving as an artificial transmission line neutralize the parasitic elements within the circuit. This allows distributed amplifiers to have higher bandwidth capabilities than typical amplifiers.

Figure 2:
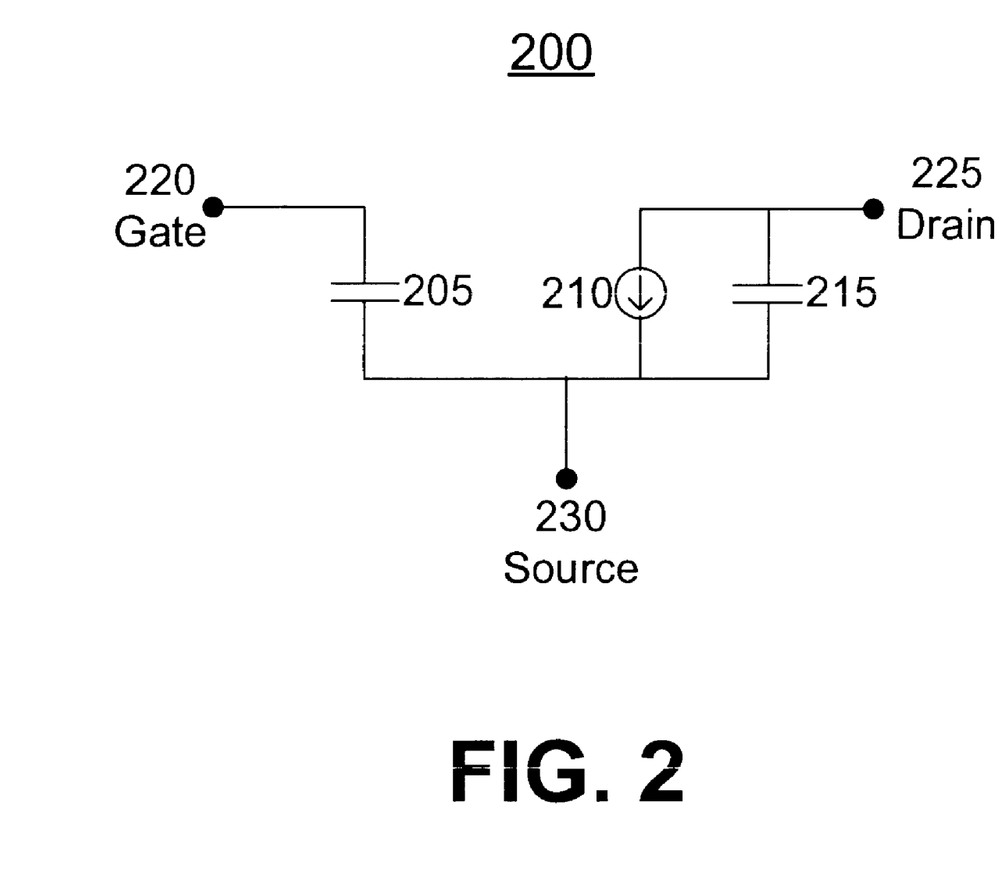
FIG. 2 is a circuit diagram that illustrates an equivalent model of a transistor in accordance with the present invention.

FIG. 2 is a circuit diagram that illustrates the ideal equivalent of a transistor. This simplified model that describes the behavior of the transistor, much like the T-model or Pi-model apply to transmission lines. Node 220 corresponds to the gate, node 225 corresponds to the drain, and node 230 corresponds to the source. Current source 210 provides a current that is dependant on the voltage applied between node 220 and node 230. The ratio of the voltage between node 220 and node 230 to the current output of the current source 210 is determined by the transconductance of transistor 200, which is dictated by the size of the transistor. Capacitors 205 and 215 represent the internal capacitances of the transistor, as previously referred to as parasitic elements that limit the performance of circuits utilizing this device. The value of these capacitors also depends upon transistor size. These internal capacitances are to be appropriately matched with the transmission lines to behave as the preferred embodiment of L-C filter.

The design of the distributed amplifier is not restricted to field-effect transistors as shown in the current embodiment. The same concepts can be applied to other transistor devices, e.g. bipolar junction transistors.

Figure 3A:
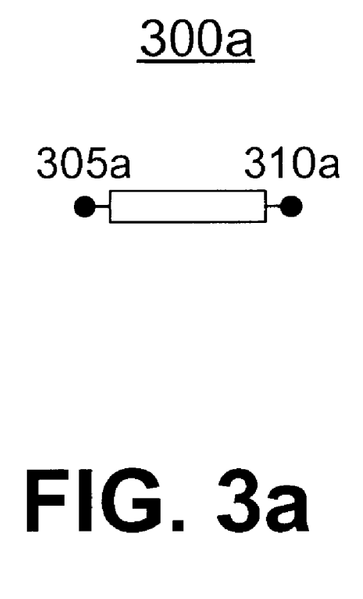
FIG. 3A illustrates a symbol for a transmission line in accordance with the present invention.

FIG. 3A illustrates a symbol for a transmission line such as 110a. Node 305a represents the input node, and node 310a represents the output node. 300a is placed between stages of distributed amplifier 100, and behaves with characteristics that can be modeled with reactive elements, i.e. inductors and capacitors. These reactive elements are chosen to appropriately balance the internal capacitances 205 and 215 of transistor 200. Using transmission line 300's parameters of transmission line length (Lline) impedance (Zline) and velocity (Vline), an equivalent circuit of inductors and capacitors can be constructed.

Figure 3B:
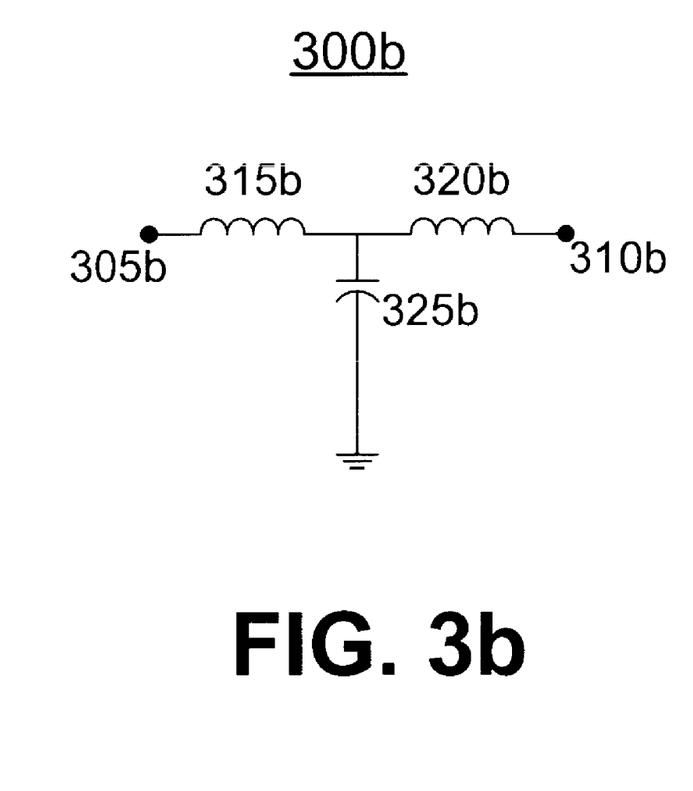
FIG. 3B is a circuit diagram that illustrates the T-model approximation of a transmission line in accordance with the present invention.

FIG. 3B is a circuit diagram that illustrates the T-model approximation of a transmission line. This approximation comprises inductors 315b and 320b, with capacitor 325b coupled to a voltage reference. Node 305b represents the input node, and node 310b represents the output node.

For the purpose of this specification, the convention L(A) will refer to the inductance of device A, and the convention C(B) will refer to the capacitance of device B. For example, C(325b) refers to the capacitance of capacitor 325b.

The conversion equations for L(315b) and L(320b) and C(325b) are:

$$L(315b)=L(320b)=((Lline*Zline)/Vline)/2$$

$$C(325b)=(Lline/(Zline*Vline))$$

Figure 3C:
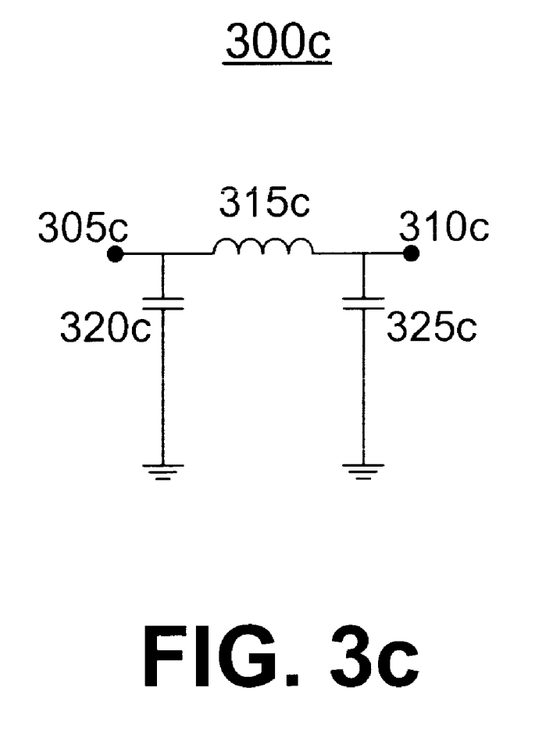
FIG. 3C is a circuit diagram that illustrates the Pi-model approximation of a transmission line in accordance with the present invention.

FIG. 3C is a circuit diagram that illustrates the Pi-model approximation of a transmission line. This approximation comprises inductor 315c with capacitors 320c and 325c coupled to a voltage reference. Node 305c represents the input node, and node 310c represents the output node. The values of the inductance and capacitances are as follows:

$$L(315c)=((Lline*Zline)/Vline)$$

$$C(320c)=C(325c)=(Lline/(Zline*Vline))/2$$

Figure 3D:
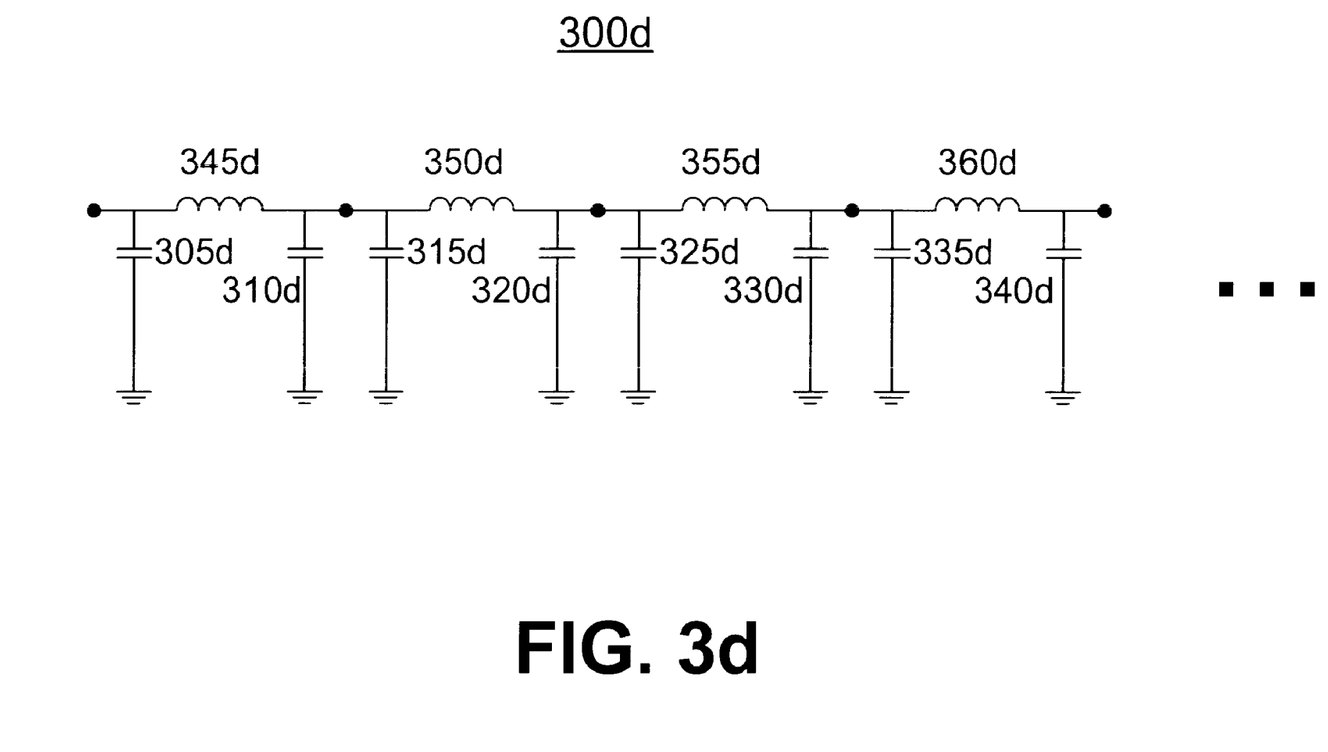
FIG. 3D is a cascade of a plurality of transmission lines approximated by the Pi-model.

FIG. 3D is a cascade of a plurality of transmission lines approximated by the Pi-model. For the purpose of building a distributed amplifier, the number of transmission lines is one fewer than the number of desired stages.

Figure 4A:
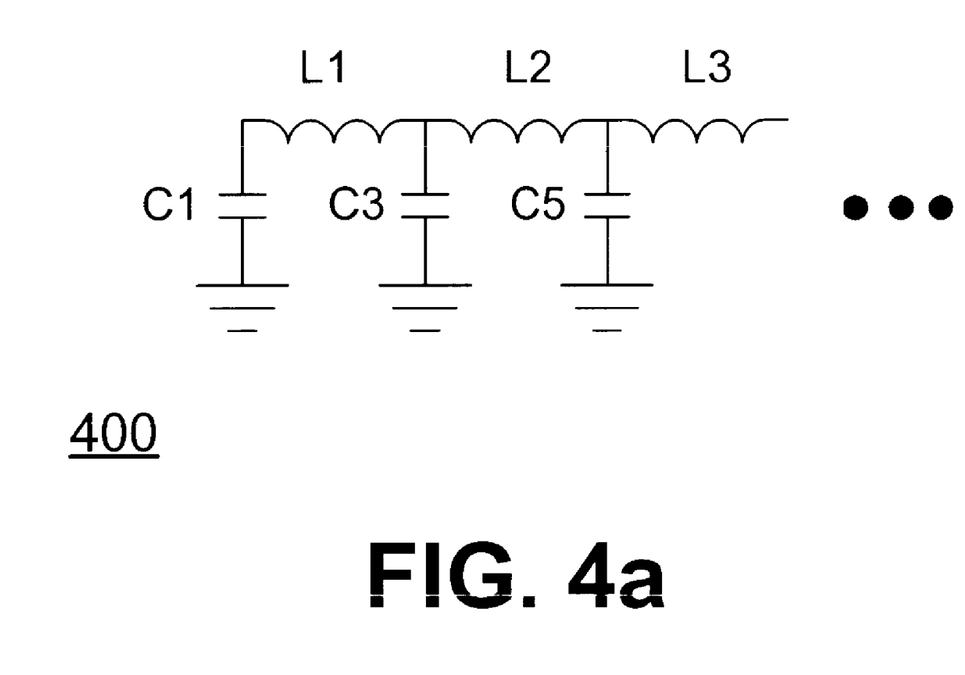
FIG. 4 is a circuit diagram that illustrates a preferred embodiment of a L-C filter in accordance with the present invention.
Figure 4B:
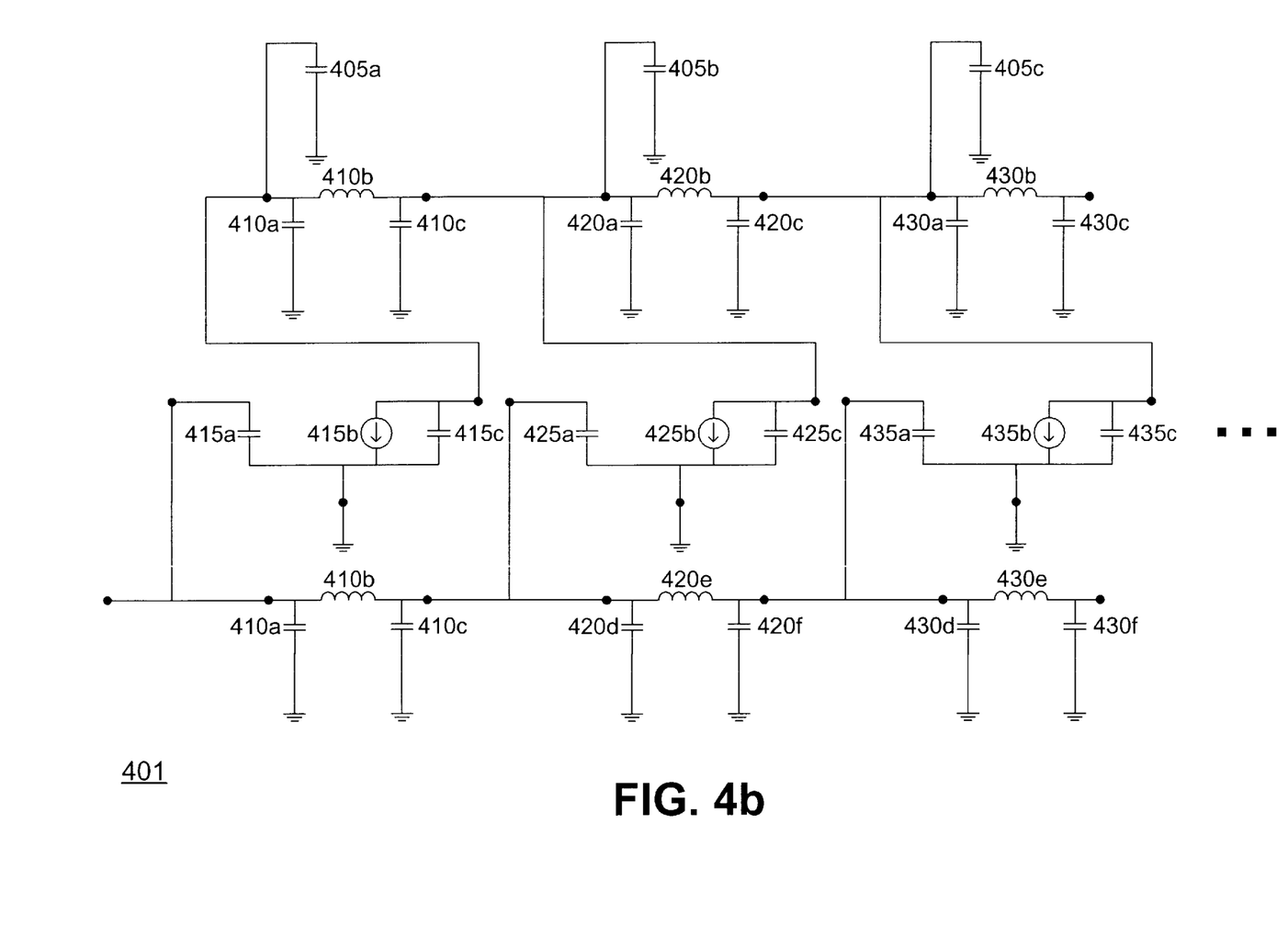
FIG. 4B is a circuit that illustrates a distributed amplifier design with transmission line components replaced with Pi-model approximations and transistors replaced with equivalent models based on the L-C filter in FIG. 4A.

FIG. 4B is a circuit that illustrates a distributed amplifier design 401 with transmission line components replaced with Pi-model approximations and transistors replaced with ideal equivalents, which is drawn from a preferred embodiment of a L-C filter 400 in accordance with the present invention. From the resulting circuit diagram the interactions between reactive elements are clear. Consistent with circuit theory, the following relationships hold:

$$C1=C(305d)$$

$$C2=C(310d)+C(315d)$$

$$L1=L(345d)$$

$$C3=C(320d)+C(325d)$$

$$L2=L(350d)$$

$$C4=C(330d)+C(335d)$$

$$L3=L(355d)$$

These variables represent the inductor and capacitor values that are needed to synthesize the filter with our desired response. Constructing the distributed amplifier with these values requires matching these values with the following equations:

$$C(410a)=C(410c)=C(410d)=C(410f) \qquad \text{Eq. 1}$$

$$L1=L(410e)=L(410b) \qquad \text{Eq. 2}$$

$$C1=C(415a)+C(410d)=C(415c)+C(405a)+C(410a) \qquad \text{Eq. 3}$$

$$C2=C(425a)+C(410f)+C(420d)=C(425c)+C(405b)+C(410c)+C(420a) \qquad \text{Eq. 4}$$

$$L2=L(420b)=L(420e) \qquad \text{Eq. 5}$$

$$C3=C(435a)+C(420f)+C(430d)=C(435c)+C(405b)+C(420c)+C(430a) \qquad \text{Eq. 6}$$

$$L3=L(430b)=L(430e) \qquad \text{Eq. 7}$$

Eq. 1 shows the equivalent relationship between capacitors 410a, 410c, 410d, and 410f. Eq. 2 shows the equivalent relationship between inductors 410b and 410e. These equations combine to dictate transmission lines of equal length in the first stage of distributed amplifier 401. Also relating to the first stage of distributed amplifier 401, Eq. 3 shows the matching of the capacitance at the input of the first stage (415a and 410d) with the output capacitance of the first stage (415c, 405a, and 410a).

The pattern continues for the number of stages of distributed amplifier 401. At each stage, the input capacitance is matched with the output capacitance. This number will vary based upon the desired filter characteristics. The resulting distributed amplifier 401 has a response that mimics the filter design that was used to determine the capacitor values C1, C2, C3, etc. and L1 L2, L3, etc. Note that the T-model can be similarly used as an alternative to this approach using the Pi-model.

Figure 5:
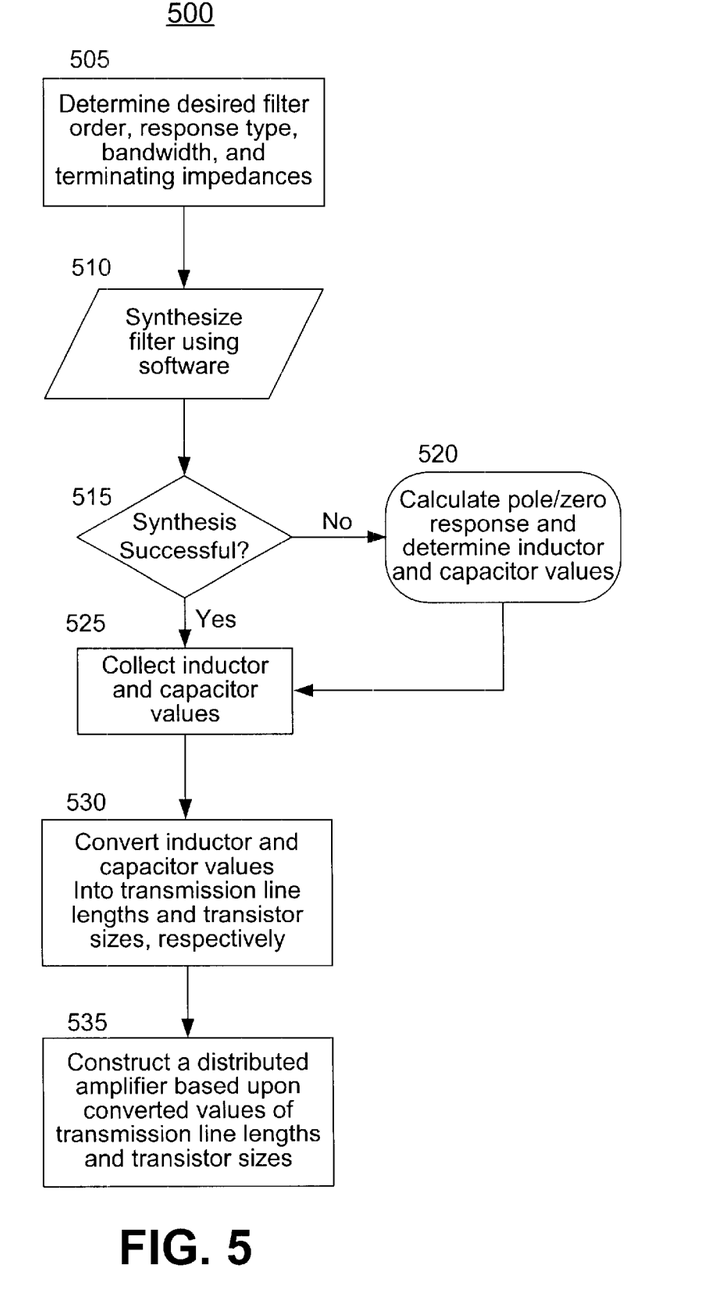
FIG. 5 is a flow diagram that illustrates the steps of constructing a distributed amplifier based on filter-synthesis techniques in accordance with the present invention.

FIG. 5 is a flow diagram that illustrates the process of constructing a distributed amplifier based on filter-synthesis techniques.

The filter order, response type, bandwidth, and terminating impedances are determined 505 based upon the designer's desired response characteristics of the distributed amplifier. As understood herein, the filter can be based upon a variety of different filter designs, e.g. Butterworth or Bessel, with the filter characteristics dependent on designer preferences and application. The filter is synthesized 510 using software-based techniques. The success of the synthesis is determined 515. If the synthesis is successful, the inductor and capacitor values are compiled 525. If the synthesis is unsuccessful, the pole/zero response is calculated and the inductor and capacitor values are determined through alternative means, e.g. reference tables 520.

The inductor and capacitor values are converted into transmission line lengths and transistor sizes, respectively

530. The inductances correspond to a particular length of transmission line. The intrinsic capacitance of capacitors is dependent on its fabricated size. At this point, the required information for the successful construction of a distributed amplifier is available and the amplifier can be synthesized 535.

Figure 6:
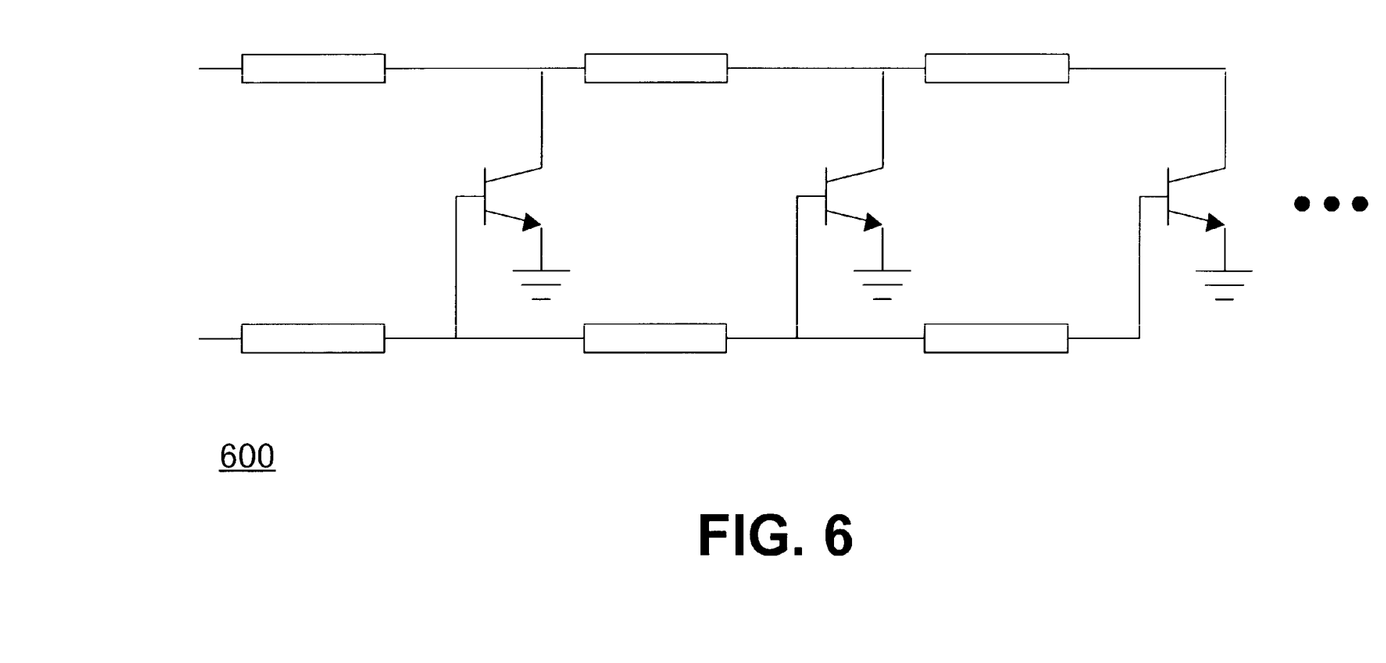
FIG. 6 is a circuit diagram that illustrates one implementation of a distributed amplifier in a single-ended transmission mode.
Figure 7:
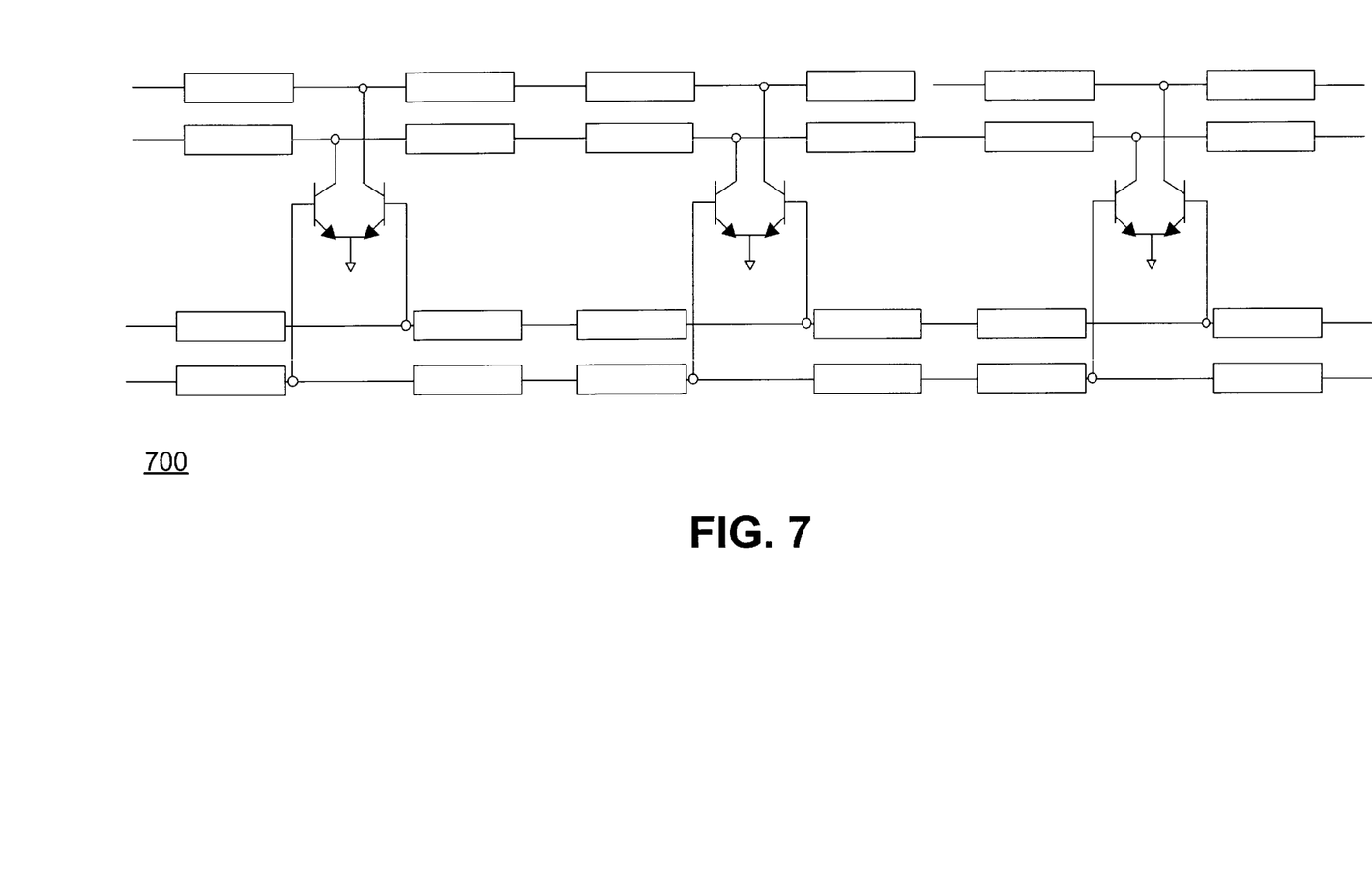
FIG. 7 is a circuit diagram that illustrates another implementation of a distributed amplifier in a differential transmission mode.

FIGS. 6–7 are circuit diagrams that illustrate implementations, respectively, of a distributed amplifier 600 in a single-ended transmission line mode and a distributed amplifier 700 in a differential transmission line mode.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

I claim:

1. A method for synthesizing a distributed amplifier, comprising:

determining a filter order; a response type, and a bandwidth, the combination of the filter order, the response type, and the bandwidth producing a pole/zero response;

computing inductor and capacitor values based on the pole/zero response;

generating an output of the inductor and capacitor values;

converting an equivalent capacitor-current source circuit into a first transistor; and converting an equivalent inductors-capacitor circuit into a first transmission line.

2. The method of claim 1, further comprising: after the determining step, feeding the filter order, the response type, and the bandwidth into a synthesis analyzer.

3. The method of claim 2, further comprising: after the feeding step, deciding if the synthesis of the filter order, the response type, and the bandwidth is successful.

4. The method of claim 1, further comprising constructing a distributed amplifier based on the converted values of the first transistor and the first transmission line.

5. A method for synthesizing a distributed amplifier, comprising:

selecting a N-order filter and determining a response type, and a bandwidth, the combination of the N-order filter order, the response type, and the bandwidth producing a pole/zero response;

computing inductor and capacitor values based on the pole/zero response;

generating an output of the inductor and capacitor values;

converting an equivalent capacitor-current source circuit into one or more transistors; and converting an equivalent inductors-capacitor circuit into one or more transmission lines, wherein a distributed amplifier with the N-order filter is constructed using the converted one or more transistors and the converted one or more transmission lines.

6. A system for designing a distributed amplifier, comprising:

means for determining a filter order; a response type, and a bandwidth, the combination of the filter order, the response type, and the bandwidth producing a pole/zero response;

means for computing inductor and capacitor values based on the pole/zero response;

means for generating an output of the inductor and capacitor values;

means for converting an equivalent capacitor-current source circuit into a first transistor; and means for converting an equivalent inductors-capacitor circuit into a first transmission line.

* * * * *